United States Patent [19]

Clarke et al.

[11] 4,075,043
[45] Feb. 21, 1978

[54] LIQUID PHASE EPITAXY METHOD OF GROWING A JUNCTION BETWEEN TWO SEMICONDUCTIVE MATERIALS UTILIZING AN INTERRUPTED GROWTH TECHNIQUE

[75] Inventors: John Elwood Clarke; Austin M. Andrews, II; Edward R. Gertner, all of Newbury Park; Joseph T. Longo; John G. Pasko, both of Thousand Oaks, all of Calif.

[73] Assignee: Rockwell International Corporation, El Segundo, Calif.

[21] Appl. No.: 719,559

[22] Filed: Sept. 1, 1976

[51] Int. Cl.² .................. H01L 21/368; H01L 21/76
[52] U.S. Cl. .................................... 148/171; 29/572;
148/1.5; 148/172; 148/175; 357/16; 357/30
[58] Field of Search ............. 148/1.5, 171, 172, 175;
252/62.3 R, 62.3 V; 29/572; 357/16, 30

[56] References Cited

U.S. PATENT DOCUMENTS

| 3,208,888 | 9/1965 | Ziegler et al. .................. 148/175 |
| 3,403,133 | 9/1968 | Frederick et al. ............ 252/62.3 V |
| 3,663,319 | 5/1972 | Rose .................................. 148/175 |
| 3,718,511 | 2/1973 | Moulin ............................... 148/171 |
| 3,737,737 | 6/1973 | Heywang et al. .............. 148/171 X |
| 3,767,481 | 10/1973 | Ettenberg et al. ................ 148/171 |
| 3,770,518 | 11/1973 | Rosztoczy et al. ................ 148/171 |
| 3,773,571 | 11/1973 | Rupprecht et al. ............. 148/171 X |
| 3,780,359 | 12/1973 | Dumke et al. .................... 148/171 X |
| 3,950,195 | 4/1976 | Rode et al. ......................... 148/171 |
| 3,959,036 | 5/1976 | Ketchow ............................ 148/171 |

OTHER PUBLICATIONS

Ladd et al., "Autodoping Effects-GaAr-Ge" Metallurgical Trans., vol. 1, Mar. 1970, pp. 609–616.
Hiscocks et al., "Crystal Pulling-PbSnTe" J. Materials Science, vol. 3, 1968, pp. 76–79.
Rolls et al., "Prep. and Prop. of Lead-Tin-Telluride Photodiodes" Solid-State Electronics, vol. 13, pp. 75–81.

Primary Examiner—L. Dewayne Rutledge
Assistant Examiner—W. G. Saba
Attorney, Agent, or Firm—L. Lee Humphries; Craig O. Malin

[57] ABSTRACT

A method of making a junction in semiconductive materials to improve the spectral response of the junction in photovoltaic detectors. A first layer of semiconductive material is grown, by epitaxy technique, on a substrate of semiconductive material of the same conductivity type. Growth of the first layer is discontinued and the temperature is changed. Then a second layer of opposite conductivity type is grown on the first layer.

5 Claims, 6 Drawing Figures

TIME IN THE ENVIRONMENT

LIQUID PHASE EPITAXY METHOD OF GROWING A JUNCTION BETWEEN TWO SEMICONDUCTIVE MATERIALS UTILIZING AN INTERRUPTED GROWTH TECHNIQUE

The invention herein described was made in the course of work under a contract with the U.S. Army.

BACKGROUND OF THE INVENTION

1. Field of the Invention

This invention relates to the field of junctions in semiconductive materials, and more particularly to junctions for use in photovoltaic detectors.

2. Description of the Prior Art

Infrared (IR) technology has received intensive research and development, from materials and devices through systems and applications. Imagery, communications, and target designation are important applications of this technology. While much progress has been made throughout the field, there is still great demand for better performance and reliability at low cost. One of the most crucial parts of the system which needs improvement is the focal plane. Any improvements in this area can ease the requirements and cost of the rest of the system.

The sensing volume of a p-n diode detector used for the focal plane is the depletion region between the $n$ and the $p$ layers. Any carriers that do not cross this region will not be counted. Thus, if light is incident on the p-n diode and all of this light is absorbed in the $n$ or $p$ region far from the junction, then no signal will be measured even though all of the light is absorbed because it is absorbed uselessly. To avoid this loss of signal, the top region, usually an n-region, of a homojunction diode is made thin so that most of the light is absorbed near or in the junction. But since light absorption is a function of the top region's thickness, the detected signal is also a function of this thickness. Non-uniformity of thickness then results in a non-uniformity of signal. Another complication associated with homojunction p-n diodes is that surface recombination can play an important role. Any variation in it will also mean non-uniformity of signal.

An atmospheric window for IR exists in the spectral range of 8 $\mu$m to 13 $\mu$m. An ideal IR array for use in this window should have a spectral response in the 8–13 $\mu$m range with constant efficiency. Previous attempts have been made to use PbSnTe in a junction as a photo-voltaic detector in this spectral range. However, these attempts have not been successful in obtaining a spectral response much beyond 11.5 $\mu$m.

To obtain longer wavelength spectral response in such a PbSnTe junction, the energy gap of the active semiconductive material must be reduced. However, prior art continuous growth techniques cannot accomplish this result because the required higher growth temperature increases the diffusion of the constituents. This causes the p-n junction to move away from the metallurgical junction, reducing the amount of light which is collected. According to the known art of epitaxy growth of semiconductive materials upon a substrate, material is deposited from environments upon the substrate by various techniques such as closed tube and open tube flow methods. Deposition occurs under continuous conditions, generally at elevated temperatures. When junctions are being grown, diffusion of constituents across the metallurgical junction causes the p-n junction to be located in one of the materials away from the metallurgical junction. When this occurs in photo-voltaic devices, the relative spectral response and quantum efficiency of the junction is reduced.

SUMMARY OF THE INVENTION

It is an object of the invention to provide a method of growing a junction between two semiconductive materials which minimizes the diffusion of the constituents within the materials.

A further object of the invention is to provide a method of growing a junction between two semiconductive materials in which the location of the p-n junction in relation to the metallurgical junction within the materials can be controlled.

It is an additional object of the invention to provide a method of growing a junction for a photovoltaic detector in which a specific range of spectral response of the detector can be obtained.

It is a further object of the invention to provide a method of fabricating an array of heterojunctions for a photovoltaic detector having an improved range of infrared wavelength detection.

According to the invention, a first layer of semiconductive material is grown by epitaxy technique on a substrate of semiconductive material of the same conductivity type. Growth of the first layer is discontinued and the temperature is changed. Then a second layer of opposite conductivity type is grown on the first layer. Predetermined locations on the second layer are isolated from each other by etching or doping to form an array of junctions.

These and other objects and features of the present invention will be apparent from the following detailed description, taken with reference to the accompanying drawings.

DESCRIPTION OF THE PREFERRED EMBODIMENT

Figure 1:
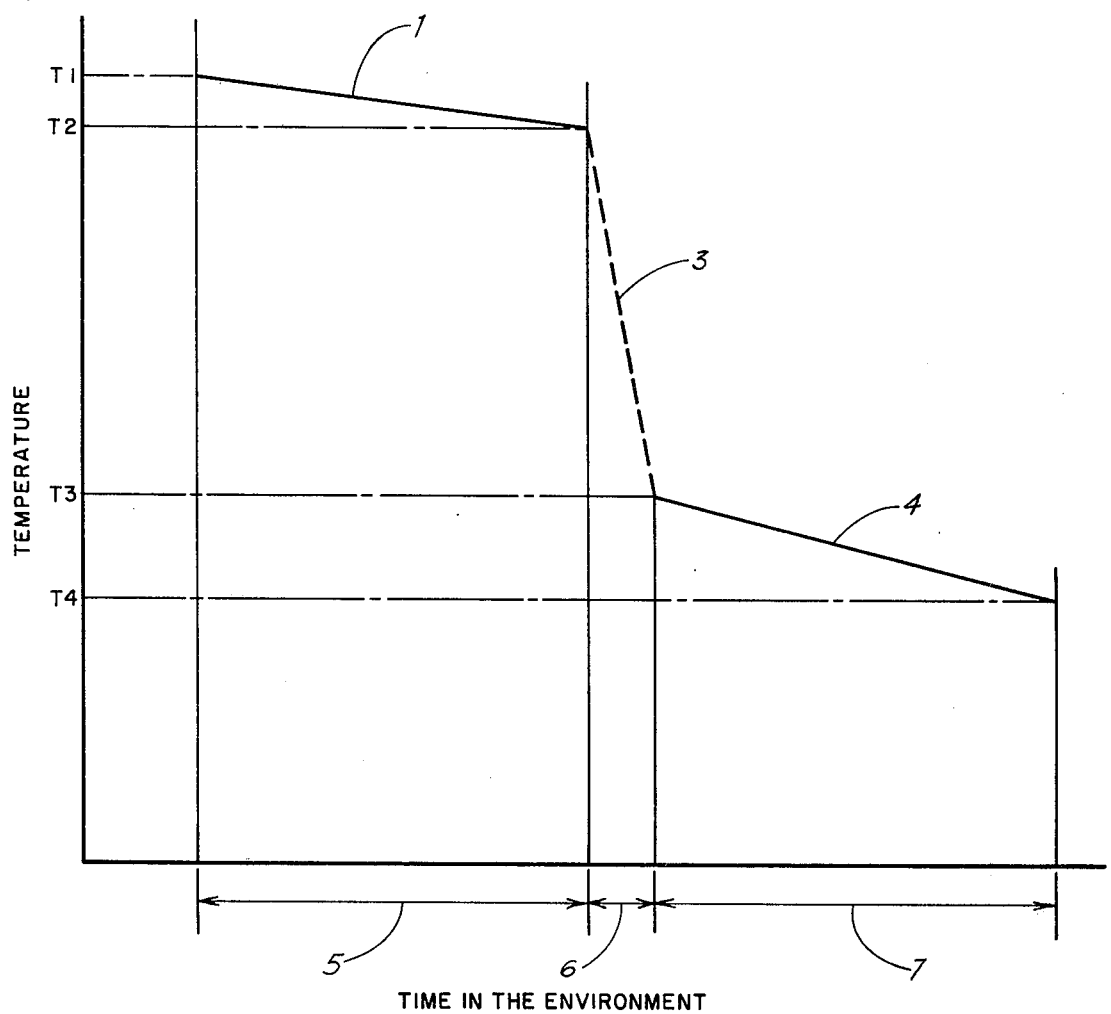
FIG. 1 is a diagram illustrating the temperature-time-environment relationship of the method according to the invention.

FIG. 1 is a diagram showing the general relationship between the temperature of epitaxial growth and the time of the growth in a particular environment, according to the invention. This relationship is applicable to known epitaxy growth techniques, such as liquid phase epitaxy (LPE); vapor phase epitaxy (VPE); and molecular beam epitaxy (MBE). A substrate of material is exposed to a first growth environment during a first time period 5 (of FIG. 1), to grow a first layer upon the substrate over a temperature range of T1 - T2. At the end of the first time period 5, the first growth environment is removed so that growth is discontinued during second time period 6. During this period of no growth, the temperature is lowered to T3.

At the end of the second time period 6, the first layer is exposed to a second growth environment during the third time period 7, and a second layer is grown directly upon the first layer in the temperature range T3 - T4. Depending upon the growth environment used, the result may be either a homojunction (junction between the same compound) or a heterojunction (junction between two different compounds).

At no time during the growth of the first layer to completion of growth of the second layer is the substrate with the deposited material removed from the growth furnace for mechanical treatment of the material. The growing operations are accomplished in situ on the surfaces as exposed in the furnace.

In a preferred embodiment of the invention, a PbTe to PbSnTe heterojunction is grown. PbSnTe is a semiconductive material having an energy gap for a given temperature which is determined by the concentration ratio of Pb to Sn. This material is a compound in which the sum of Pb and Sn equals 50 atomic percent of the compound, as represented by the formula $(Pb_{1-x}Sn_x)Te$. Attempts to use this material as a photovoltaic detector have not been successful in obtaining a spectral response much beyond 11.5 $\mu$m.

A p-n heterojunction diode can be made of p-type PbSnTe and n-type PbTe where the carrier concentrations are such that the depletion region is mainly in the p-region. The energy gap of the PbTe is such that it is transparent to 8-13 $\mu$m radiation (except for free carrier absorption), but will absorb strongly below 6 $\mu$m. Therefore the n-type PbTe layer, while serving as one side of the junction, acts as a window to the incident 8-13 $\mu$m radiation and a filter to radiation below 6 $\mu$m. The 8-13 $\mu$m radiation will then be completely absorbed in and near the depletion region and the signal is independent of both the top layer thickness and surface recombination so that the quantum efficiency is high. This characteristic makes the PbSnTe heterojunction ideal for a photovoltaic detector operating in the atmospheric window for IR at 8-13 $\mu$m, provided that the depletion region at the n-p junction is mainly in the PbSnTe p-type layer. The 8-13 $\mu$m radiation is then completely absorbed in or near the depletion region and the signal is independent of both the n-type layer thickness and surface recombination. The diode quantum efficiency can then approach its theoretical maximum.

In a preferred embodiment, a substrate of $(Pb_{1-x}Sn_x)Te$ with a <100> orientation is obtained using known crystal growth techniques, such as vapor growth of crystal boules in ampoules. The ratio of Pb to Sn (the value of $x$) is selected based upon the known relationship between the energy gap desired in the active layer and the composition of the materials. As an example, a ratio of Pb to Sn of 0.8 to 0.2 ($x = 0.2$) has been used in junctions fabricated according to the method of the invention.

Figure 2:
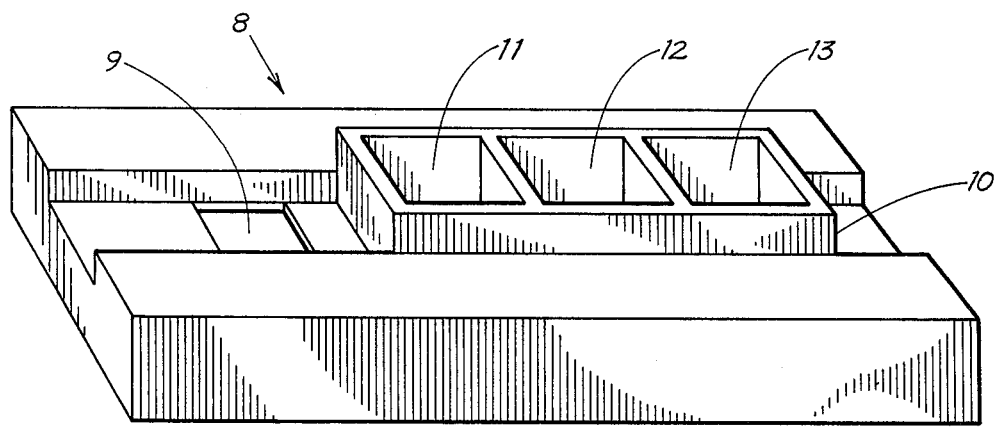
FIG. 2 is a perspective of a graphite boat used to practice the method according to the invention.

Referring to FIG. 2, the substrate is placed on a bed 9 in a graphite boat 8 having a moveable tray 10 with compartments 11, 12, and 13 that can be positioned over the substrate. A first compartment 11 is filled with Pb, Sn and sufficient Te to saturate the Pb-Sn alloy at the growth temperature. A suitable composition can be derived from published phase diagrams for the particular alloy system (for the PbSnTe system see, for example, "Semiconductive and Semimetals", Vol. 5, by I. Melngailis and T. P. Harmon). To prevent excessive vaporization, the Te is added as the compound PbTe. In one embodiment, the amounts of Pb and Sn in the compartment 11 are in equal atomic percent.

The graphite boat 8 is placed in a furnace having a H$_2$ atmosphere and heated to 550° C (T1 of FIG. 1). The tray 10 is moved to position the compartment 11, containing the molten PbSnTe alloy, over the substrate and the temperature decreased to 540° C (T2). During this step, an epitaxial layer of (Pb$_8$Sn$_2$)Te grows onto the substrate.

When 540° C is reached (T2), the tray is again moved to position an empty compartment 12 over the substrate. This movement skims off the surplus molten PbSnTe and leaves a thin (approximately 5 $\mu$m) layer of PbSnTe on the substrate exposed only to the hydrogen atmosphere of the furnace.

The temperature of the furnace is lowered to 470° C (T3 of FIG. 1) and the third compartment of the tray 13, containing Pb saturated in the Te, is moved over the part. Epitaxial growth of the PbTe then occurs as the temperature is decreased from 470° C to 450° C (T3 to T4). At 450° C (T4), the third compartment 13 is moved, skimming the surplus PbTe from the surface and leaving a second layer of PbTe approximately 5 $\mu$m thick. Because the PbTe melt is not exposed to the first layer of PbSnTe until after the temperature has been reduced to T3, diffusion of the constituents between the layers is kept at a minimum and a sharply defined heterojunction is obtained with the electrical p-n junction being close to the metallurgical junction.

Figure 3:
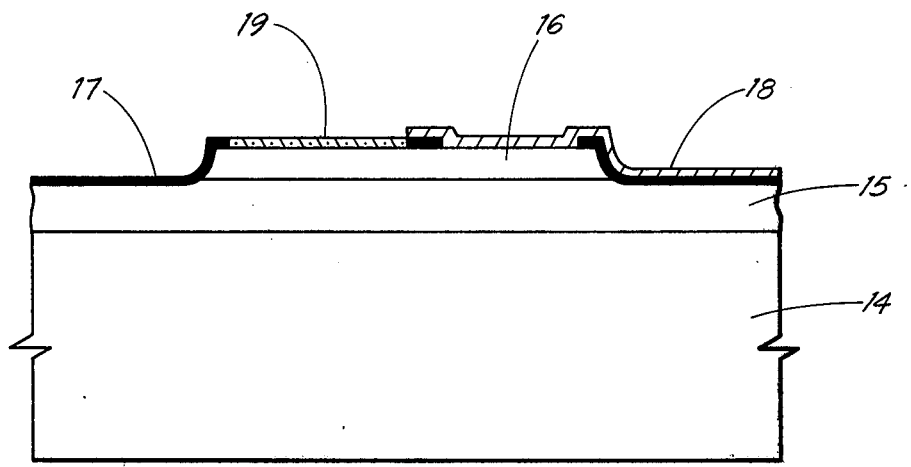
FIG. 3 is an illustration of a mesa from an array using a heterojunction of the invention.

Predetermined areas on the second layer can be isolated by etching or doping, using known technology, to provide an array of heterojunctions. FIG. 3 shows an element in a mesa-type array created by etching portions of the second layer down to the first layer 15 to create mesas 16 in the second layer. Photo-resist insulation 17 and metal stripline 18 are deposited to make electrical contact to mesa 16. An anti-reflection coating 19 is deposited on mesa 16 to increase the spectral efficiency and the entire array is carried by substrate 14.

Figure 4:
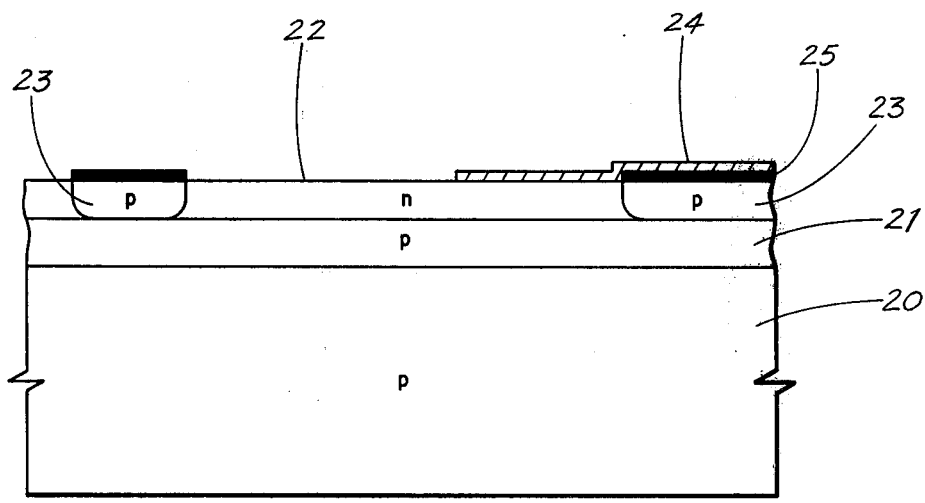
FIG. 4 is an illustration of an element from an array created by doping a heterojunction of the invention.

FIG. 4 shows an element in an array created by doping the second layer 22 to provide isolated locations 23 in the second layer 22. Layer 22 is masked to provide a suitable array pattern and unmasked portions are then doped to provide regions 23 of the same conductivity type as the first layer 21. In the example shown in FIG. 4, the substrate 20 and first layer 21 are p-type material, the second layer 22 is n-type, and the doped isolation areas 23 are p-type. Electrical connection is made to the isolated portions of the second layer through stripline 24 insulated by photoresist 25.

Figure 5:
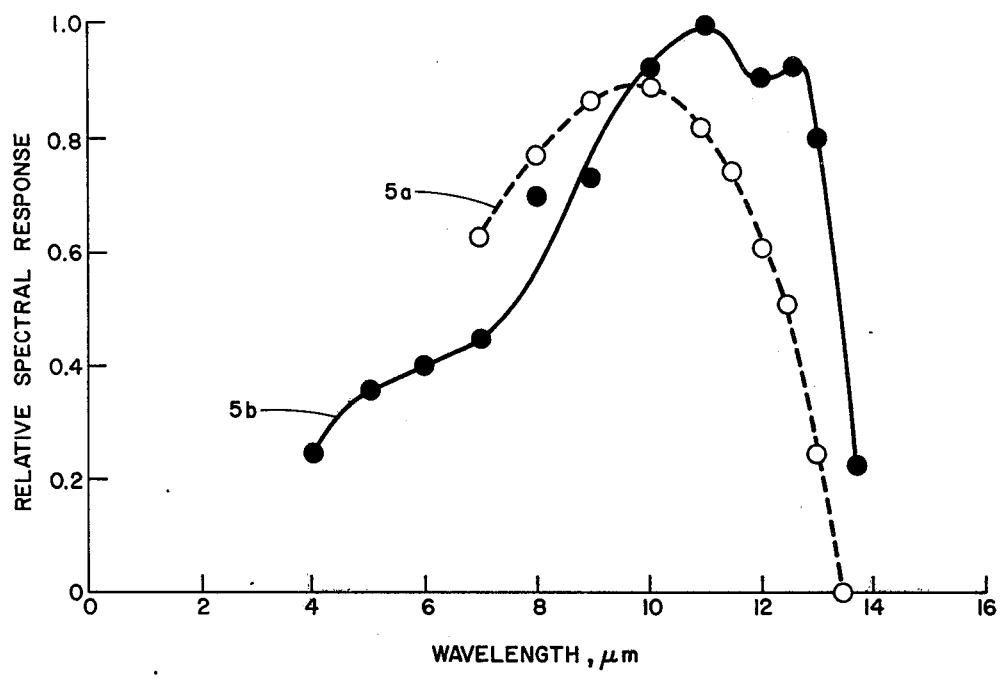
FIG. 5 shows the relative spectral response obtained (a) using prior art continuous growth, and (b) using the discontinuous growth method of the invention.

FIG. 5 illustrates the improvement obtained in the relative spectral response of (Pb$_{.8}$Sn$_{.2}$)Te photovoltaic devices produced according to the discontinuous growth method of the invention (5b) as compared to the prior art continuous growth method (5a). The relative spectral response is a normalized measure of the number of photons collected by the device divided by the energy of the incident photons. As shown, the prior art device peaks at 10 $\mu$m and falls off rapidly thereafter, whereas the device produced by the discontinuous growth method does not fall off rapidly until after 13 $\mu$m.

Figure 6:
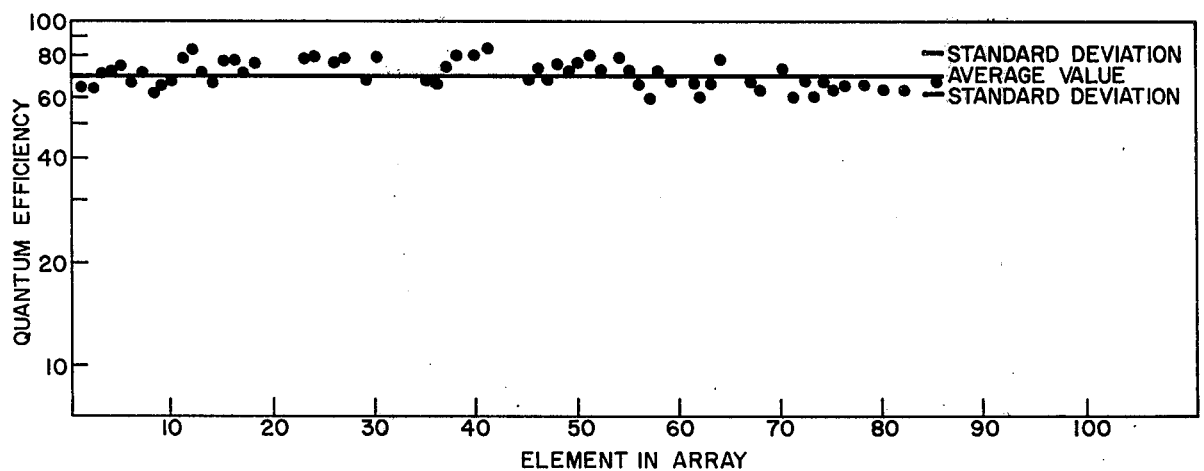
FIG. 6 shows the quantum efficiency of individual elements in an array produced according to the invention.

FIG. 6 shows the quantum efficiency of individual elements in a photovoltaic array produced by the method of the invention. The quantum efficiency is a gauge of the performance of the device. It is a measure of the signal current produced for a specified flux of photons times the electronic charge, measured at the average peak wavelength. The average quantum efficiency measured for this array is 69% at 12.5 μm. This discontinuous growth method is the only method developed which can achieve such efficiency at greater than 12 μm in a PbSnTe detector array.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A method of obtaining a heterojunction comprising the following continuous series of steps:
   providing a substrate of $(Pb_{1-x}Sn_x)Te$;
   placing a first growth environment comprising a melt of Pb, Sn, and Te in contact with said substrate;
   growing in situ by liquid phase epitaxy technique a first layer comprising $(Pb_{1-x}Sn_x)Te$ on said substrate from a first temperature to a lower second temperature;
   removing said first environment to discontinue said growing of a first layer
   changing said second temperature to a lower third temperature;
   placing a second growth environment comprising a melt of Pb and Te in contact with said first layer; and
   growing in situ by liquid phase epitaxy technique a second layer comprising PbTe on said first layer from said third temperature to a lower fourth temperature.

2. The method as claimed in claim 1, wherein $x$ is 0.2

3. The method as claimed in claim 1, including the step of isolating predetermined locations of said second layer from each other, whereby an array of said junctions are provided.

4. The method as claimed in claim 3, wherein said step of isolating comprises masking selected areas of said second layer and etching away unmasked portions of said second layer to form mesas of said second layer.

5. The method as claimed in claim 3, wherein said step of isolating comprises masking selected areas of said second layer and doping unmasked portions of said second layer to create regions in said second layer having the same conductivity type material as said first layer.

* * * * *